US011047065B2

(12) United States Patent
Narushima et al.

(10) Patent No.: US 11,047,065 B2
(45) Date of Patent: Jun. 29, 2021

(54) METHOD FOR PRODUCING SILICON SINGLE CRYSTAL, HEAT SHIELD, AND SINGLE CRYSTAL PULLING DEVICE

(71) Applicant: SUMCO CORPORATION, Tokyo (JP)

(72) Inventors: Yasuhito Narushima, Tokyo (JP); Masayuki Uto, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/471,805

(22) PCT Filed: Oct. 12, 2017

(86) PCT No.: PCT/JP2017/036992
§ 371 (c)(1),
(2) Date: Jun. 20, 2019

(87) PCT Pub. No.: WO2018/116590
PCT Pub. Date: Jun. 28, 2018

(65) Prior Publication Data
US 2020/0115821 A1  Apr. 16, 2020

(30) Foreign Application Priority Data
Dec. 22, 2016 (JP) .............................. JP2016-249119

(51) Int. Cl.
*C30B 15/02* (2006.01)
*C30B 15/20* (2006.01)
(Continued)

(52) U.S. Cl.
CPC ............ *C30B 15/203* (2013.01); *C30B 15/14* (2013.01); *C30B 15/30* (2013.01); *C30B 29/06* (2013.01)

(58) Field of Classification Search
CPC .......... C30B 15/02; C30B 15/00; C30B 15/22
See application file for complete search history.

(56) References Cited

U.S. PATENT DOCUMENTS 4,049,384 A * 9/1977 Wenckus ............... C30B 11/002
117/203
5,450,814 A * 9/1995 Shiraishi ................. C30B 15/14
117/202

(Continued)

FOREIGN PATENT DOCUMENTS

| CN | 1265712 A | 9/2000 |
|---|---|---|
| CN | 1556257 | 12/2004 |

(Continued)

OTHER PUBLICATIONS

International Search Report issued in International Patent Application No. PCT/JP2017/036992, dated Dec. 12, 2017.

(Continued)

*Primary Examiner* — Robert M Kunemund
(74) *Attorney, Agent, or Firm* — Greenblum & Bernstein, P.L.C.

(57) ABSTRACT

A method of producing a monocrystalline silicon uses a monocrystal pull-up apparatus including a crucible, a crucible driver, a pull-up portion, a heat shield having a circular hollow cylindrical lower end portion, and a chamber. The heat shield satisfies a formula (1) below in growing the monocrystalline silicon, $$R \leq 1.27 \times C \qquad (1)$$

where C represents a radius (mm) of a straight body of the monocrystalline silicon, and R represents an inner radius (mm) at the lower end portion of the heat shield.

18 Claims, 9 Drawing Sheets

(51) Int. Cl.
*C30B 15/14* (2006.01)
*C30B 15/30* (2006.01)
*C30B 29/06* (2006.01)

(56) References Cited

U.S. PATENT DOCUMENTS

| | | | | |
|---|---|---|---|---|
| 6,059,876 | A * | 5/2000 | Yin | C30B 15/04 |
| | | | | 117/19 |
| 6,702,892 | B2 * | 3/2004 | Okui | C30B 15/14 |
| | | | | 117/13 |
| 8,961,686 | B2 * | 2/2015 | Kawazoe | C30B 15/04 |
| | | | | 117/13 |
| 9,074,298 | B2 | 7/2015 | Kawawoe et al. | |
| 10,233,564 | B2 * | 3/2019 | Narushima | C30B 15/22 |
| 2006/0124052 | A1 * | 6/2006 | Harada | C30B 15/14 |
| | | | | 117/217 |
| 2008/0127886 | A1 * | 6/2008 | Sasaki | C30B 15/14 |
| | | | | 117/217 |
| 2009/0314996 | A1 | 12/2009 | Kawazoe et al. | |
| 2010/0212580 | A1 | 8/2010 | Kawazoe et al. | |
| 2011/0140241 | A1 | 6/2011 | Kawawoe et al. | |
| 2016/0208408 | A1 | 7/2016 | Sung et al. | |

FOREIGN PATENT DOCUMENTS

| | | |
|---|---|---|
| CN | 201058893 Y | 5/2008 |
| JP | 2001-039798 A | 2/2001 |
| JP | 2009-242142 A | 10/2009 |
| JP | 2010-024129 A | 2/2010 |
| JP | 2010-202436 A | 9/2010 |
| JP | 2013-075785 A | 4/2013 |
| JP | 5420548 B2 | 2/2014 |
| JP | 2016-529198 A | 9/2016 |
| KR | 10-2009-0072264 A | 7/2009 |
| WO | WO 2004/027124 A1 | 4/2004 |

OTHER PUBLICATIONS

International Preliminary Report on Patentability for PCT/JP2017/036992, dated Jun. 25, 2019.

Office Action for CN App. No. 201780079592.2, dated Dec. 7, 2020 (w/ translation).

Notice of Allowance for KR App. No. 10-2019-7019153, dated Feb. 25, 2021 (w/ partial translation).

* cited by examiner

METHOD FOR PRODUCING SILICON SINGLE CRYSTAL, HEAT SHIELD, AND SINGLE CRYSTAL PULLING DEVICE

TECHNICAL FIELD

The present invention relates to a method of producing a monocrystalline silicon, a heat shield, and a monocrystal pull-up apparatus.

BACKGROUND ART

In recent years, there is a growing demand for a monocrystalline silicon with low electrical resistivity. In order to produce such a monocrystalline silicon, n-type dopant such as red phosphorus is sometimes added. However, the addition of n-type dopant sometimes causes dislocation. Studies have been made in order to reduce the dislocation (see, for instance, Patent Literature 1).

According to the method disclosed in Patent Literature 1, a temperature difference between a dopant-added melt, in which red phosphorus is added to a silicon melt, and a seed crystal is set in a range of 50 to 97 K when the seed crystal is brought into contact with the dopant-added melt. Further, the distance between a heat-shielding plate and dopant-added-melt liquid surface is set in a range of 20 mm to 30 mm at the start of a growth period of a straight body of a monocrystalline silicon and in a range of 6 mm to 15 mm during a growth period of a part of the straight body remote from a border between a shoulder and the straight body by 200 mm in a direction opposite a pulling direction.

CITATION LIST

Patent Literature

Patent Literature 1 Japanese Patent No. 5420548

SUMMARY OF THE INVENTION

Problem(s) to be Solved by the Invention

However, dislocation sometimes occurs due to compositional supercooling at a bottom portion of a monocrystalline silicon (a part of a straight body whose solidification rate is 60% or more, where the solidification rate at an upper end of the straight body is defined as 0% and the solidification rate at a lower end of the straight body is defined as 100%) according to the method disclosed in Patent Literature 1. Thus, a producing method capable of more effectively reducing occurrence of dislocation has been desired.

An object of the invention is to provide a method of producing a monocrystalline silicon capable of reducing occurrence of dislocation, a heat shield, and a monocrystal pull-up apparatus.

Means for Solving the Problem(s)

A method of producing a monocrystalline silicon according to an aspect of the invention uses a monocrystal pull-up apparatus including: a crucible configured to receive a dopant-added melt including a silicon melt and red phosphorus added to the silicon melt; a crucible driver configured to vertically move and rotate the crucible; a pull-up portion configured to pull up a seed crystal after bringing the seed crystal into contact with the dopant-added melt to grow the monocrystalline silicon; a heat shield disposed above the crucible to surround the monocrystalline silicon, a lower end portion of the heat shield being in a form of a circular hollow cylinder; and a chamber configured to house the crucible and the heat shield, the method including: growing the monocrystalline silicon using the heat shield satisfying a formula (1) below, $$R \leq 1.27 \times C \quad (1)$$

where C represents a radius (mm) of a straight body of the monocrystalline silicon, and R represents an inner radius (mm) of the heat shield at the lower end portion thereof.

According to the above aspect of the invention, the heat shield satisfying the formula (1) is used. Since the distance between an outer periphery of the monocrystalline silicon and an inner periphery of the lower end portion of the heat shield is reduced to be shorter than a predetermined value, heat dissipation from the dopant-added melt through the gap between the monocrystalline silicon and the lower end of the heat shield can be reduced, thus increasing the temperature gradient at the bottom portion of the monocrystalline silicon in the pulling direction as compared with an instance where the formula (1) is not satisfied. Accordingly, the occurrence of dislocation due to compositional supercooling can be restrained.

The "lower end portion in a form of a circular hollow cylinder" may be exemplified by a downwardly flared or tapered hollow truncated cone, a cylinder of constant diameter at any vertical position thereof, a combination of a hollow truncated cone and a cylinder, and a combination of a tapered hollow truncated cone and a flared hollow truncated cone.

In the method of producing a monocrystalline silicon according to the above aspect of the invention, it is preferable that the heat shield is provided with at least one cut recessed from an inner periphery of the lower end portion of the heat shield toward an outer periphery thereof.

The above arrangement allows the dopant-added melt to be exposed through the cut in a top plan. Thus, a sufficient liquid-surface exposure area for checking a height of the liquid surface can be ensured. Accordingly, the crucible can be moved upward so that the distance between the liquid surface of the dopant-added melt and the lower end of the heat shield becomes at a predetermined value during the growth of the monocrystalline silicon, thereby keeping thermal hysteresis and impurity (e.g. oxygen) concentration constant in each of batches of monocrystalline silicon and producing monocrystalline silicon of stable quality.

In the method of producing a monocrystalline silicon according to the above aspect of the invention, it is preferable that the heat shield further satisfies formulae (2) and (3) below, $$0.926 \leq R/A \quad (2)$$

$$R/A \leq 0.969 \quad (3)$$

where A represents a distance (mm) from a center of the lower end portion of the heat shield to a radially deepest portion of the lower end portion at the cut in a top plan.

When R/A is less than 0.926, the cut is too deep (i.e. A is too large) to stabilize the temperature distribution at the dopant-added-melt liquid surface in an outer circumferential direction of the monocrystalline silicon. When high-temperature silicon melt enters solid-liquid interface due to the instability in the temperature distribution, the monocrystalline silicon is melted (i.e. remelting) and again solidified to generate, for instance, curved growth striations with centerdented profiles. As a result, a remelt growth area Q is formed as shown in FIG. 1 at an outer periphery of a shoulder of a monocrystalline silicon SM between a lowermost one of convex growth striations (growth striation P1) generated radially all over the straight body and an uppermost one of concave growth striations (uppermost growth striation P2) generated below the growth striation P1. The dislocation may occur at a top portion (a region of the straight body with a solidification rate ranging from 0% to 20%, and the shoulder) of the monocrystalline silicon due to an influence of the remelt growth area Q.

When R/A exceeds 0.969, the cut is too shallow (i.e. A is too small) to secure the sufficient liquid-surface exposure area, possibly making it difficult to check the height of the liquid surface of the dopant-added melt.

When the formula (2) is satisfied as in the above arrangement, the occurrence of dislocation at the top portion of the monocrystalline silicon can be restrained. When the formula (3) is satisfied, the height of the liquid surface can be easily checked to stabilize the quality of the monocrystalline silicon.

In the method of producing a monocrystalline silicon according to the above aspect of the invention, it is preferable that the heat shield further satisfies formulae (4) and (5) below, $$0.051 \leq H/L \quad (4)$$

$$H/L \leq 0.070 \quad (5)$$

where H represents a maximum width (mm) of the cut in a top plan, and

L represents a length (mm) of an inner circumference of the lower end portion of the heat shield assuming that the cut is not present.

When H/L is less than 0.051, the width of the cut is too narrow to secure the sufficient liquid-surface exposure area, possibly making it difficult to check the height of the liquid surface of the dopant-added melt.

When H/L exceeds 0.070 (i.e. when the cut width is too large), the temperature distribution at the dopant-added-melt liquid surface in the outer circumferential direction of the monocrystalline silicon becomes unstable and, consequently, dislocation may occur at the top portion of the monocrystalline silicon due to the above-described remelting.

When the formula (5) is satisfied as in the above arrangement, the occurrence of dislocation at the top portion of the monocrystalline silicon can be restrained. When the formula (4) is satisfied, the height of the liquid surface can be easily checked to stabilize the quality of the monocrystalline silicon.

It should be noted that, when a plurality of cuts are provided, H represents a sum of the maximum widths of the plurality of cuts.

In the method of producing a monocrystalline silicon according to the above aspect of the invention, it is preferable that the at least one cut is a single cut.

According to the above arrangement, the maximum width of the cut can be increased to secure a sufficient liquid-surface exposure area as compared with an instance in which the plurality of cuts are provided. Consequently, the height of the liquid surface of the dopant-added melt can be easily checked.

In the method of producing a monocrystalline silicon according to the above aspect of the invention, it is preferable that, in growing the monocrystalline silicon, an image of a liquid surface of the dopant-added melt exposed through the cut is captured, a height of the liquid surface of the dopant-added melt is detected based on a result of the image-capturing, and the crucible is moved upward so that a distance between the liquid surface and a lower end of the heat shield becomes at a predetermined value.

In the method of producing a monocrystalline silicon according to the above aspect of the invention, it is preferable that, in growing the monocrystalline silicon, a laser beam is emitted onto a liquid surface of the dopant-added melt exposed through the cut and a reflected light of the laser beam is received, a height of the liquid surface of the dopant-added melt is detected based on a result of the received reflected light, and the crucible is moved upward so that a distance between the liquid surface and a lower end of the heat shield becomes at a predetermined value.

According to the above arrangements, the height of the liquid surface of the dopant-added melt can be accurately detected using the image-capturing unit and the laser beam, so that the quality of the monocrystalline silicon can be further stabilized.

In the method of producing a monocrystalline silicon according to the above aspect of the invention, it is preferable that the heat shield includes a downwardly tapered cylindrical portion in a form of a hollow truncated cone, and an annular portion projecting from a lower end of the cylindrical portion to a center of the cylindrical portion.

In the method of producing a monocrystalline silicon according to the above aspect of the invention, it is preferable that the straight body is configured to produce a 200-mm diameter silicon wafer, and a resistivity at a lower end of the straight body of the grown monocrystalline silicon is in a range from 0.5 mΩ·cm to 0.7 mΩ·cm.

In the method of producing a monocrystalline silicon according to the above aspect of the invention, it is preferable that the straight body is configured to produce a 300-mm diameter silicon wafer, and a resistivity at a lower end of the straight body of the grown monocrystalline silicon is in a range from 0.78 mΩ·cm to 1.0 mΩ·cm.

A heat shield according to another aspect of the invention is configured to be installed in a monocrystal pull-up apparatus comprising: a crucible configured to receive a dopant-added melt including a silicon melt and red phosphorus added to the silicon melt; a crucible driver configured to vertically move and rotate the crucible; a pull-up portion configured to pull up a seed crystal after bringing the seed crystal into contact with a dopant-added melt to grow the monocrystalline silicon; and a chamber configured to house the crucible and the heat shield, the heat shield being disposed above the crucible to surround the monocrystalline silicon, the heat shield including: a cylindrical portion comprising a circular hollow cylindrical lower end portion; and an annular portion projecting from the lower end portion of the cylindrical portion toward a center of the cylindrical portion, where the annular portion is provided with at least one cut recessed from an inner periphery of the annular portion to an outer periphery thereof, the annular portion being configured to satisfy formulae (6), (7) below, $$(C+30) \times 0.926 \leq R \quad (6)$$

$$R \leq 1.27 \times C \quad (7)$$

where C represents a radius (mm) of a straight body of the monocrystalline silicon, and R represents an inner radius (mm) of the annular portion.

An annular meniscus is formed around a growing monocrystalline silicon due to surface tension at and near a growth surface of the monocrystalline silicon. A distance between an outer circumference of the monocrystalline silicon to an outer periphery of the meniscus (referred to as "meniscus width" hereinafter) is determined by physical properties of the dopant-added melt, and thus is substantially constant irrespective of the size of the monocrystalline silicon. When an image of the surface of the meniscus, which is curved, is captured to detect the height of the liquid surface, the shape of the cut reflected on the surface of the meniscus may be distorted, possibly failing to correctly detect the height of the liquid surface. When laser beam is emitted onto the surface of the meniscus to detect the height of the liquid surface based on the receipt result of the reflected light, the reflecting direction of the reflected light becomes difficult to predict. Thus, it could be difficult to locate the light receiver at an appropriate position.

However, the shape of the meniscus becomes flatter toward the outer periphery. Thus, the shape of the cut can be appropriately imaged at a position outside a predetermined position on the surface of the meniscus, and the reflecting direction can be easily predicted, allowing the light receiver to be easily located at an appropriate position. The predetermined position is a position 30 mm away from the inner periphery of the meniscus.

A region of the liquid surface affecting detection of the height of the liquid surface, which is located between the inner periphery of the meniscus and the position remote from the inner periphery by 30 mm, will be referred to as a detection-affecting region hereinafter. Further, a region of the liquid surface outside the detection-affecting region, which does not affect the detection of the height of the liquid surface, will be referred to as a detection-non-affecting region hereinafter. The numeral "30" in the formula (6) represents a width of the detection-affecting region.

Further, "0.926" in the formula (6) represents a minimum value of R/A capable of restraining the occurrence of dislocation at the top portion of the monocrystalline silicon as shown in the formula (2).

When the formula (6) is satisfied as in the above arrangement, the position of the deepest portion of the cut in a top plan can be located outside the detection-affecting region, so that the detection-non-affecting region can be exposed through the cut. As a result, the height of the liquid surface of the dopant-added melt can be accurately detected by capturing the image of the exposed detection-non-affecting region or emitting laser beam onto the detection-non-affecting region. The quality of the monocrystalline silicon can thus be stabilized by producing the monocrystalline silicon based on the detection results. Further, the temperature distribution in the dopant-added-melt liquid surface in the outer circumferential direction of the monocrystalline silicon can be stabilized, so that the occurrence of dislocation at the top portion of the monocrystalline silicon can be restrained.

When the formula (7) is satisfied, the occurrence of dislocation at the bottom portion of the monocrystalline silicon can be restrained in the same manner as when the formula (1) is satisfied.

In the heat shield according to the above aspect of the invention, it is preferable that the cut is configured to satisfy a formula (8) below, $$D \leq R \times 0.08 \quad (8)$$

where D represents a maximum depth (mm) of the cut in a top plan of the annular portion.

The maximum depth of the cut in a top plan is a value subtracting R used in the formula (6) from A used in the formula (2) (A herein represents a distance from the center of the annular portion to a radially deepest portion of the annular portion in the cut). The maximum depth represents a distance from the radially deepest portion of the annular portion in the cut to the inner periphery of the annular portion assuming that the cut is not present. In other words, a relationship of "D=A−R" is satisfied. The formula (8) is derived from the formula (2) and "D=A−R."

Since the formula (8) is satisfied in the above arrangement, the occurrence of dislocation at the top portion of the monocrystalline silicon can be restrained as described above.

In the heat shield according to the above aspect of the invention, it is preferable that the cut is configured to satisfy formulae (9) and (10) below, $$0.051 \leq H/L \quad (9)$$

$$H/L \leq 0.070 \quad (10)$$

where H represents a maximum width (mm) of the cut in a top plan of the annular portion, and L represents a length (mm) of an inner circumference of the annular portion assuming that the cut is not present.

In the heat shield according to the above aspect of the invention, it is preferable that the at least one cut is a single cut.

A monocrystal pull-up apparatus according to still another aspect of the invention includes: a crucible configured to receive a dopant-added melt comprising a silicon melt and red phosphorus added to the silicon melt; a crucible driver configured to vertically move and rotate the crucible; a pull-up portion configured to pull up a seed crystal after bringing the seed crystal into contact with the dopant-added melt to grow the monocrystalline silicon; the heat shield according to the above aspect of the invention, the heat shield being disposed above the crucible to surround the monocrystalline silicon; and a chamber configured to house the crucible and the heat shield.

BRIEF DESCRIPTION OF DRAWING(S)

FIG. 1 schematically illustrates a remelt growth area.

FIG. 2 schematically illustrates a configuration of a monocrystal pull-up apparatus according to first and third exemplary embodiments of the invention.

FIG. 3 schematically illustrates a configuration of a heat shield according to the first exemplary embodiment.

FIG. 4 is a graph showing an exemplary resistivity distribution in a monocrystalline silicon according to the first exemplary embodiment.

FIG. 5 schematically illustrates a configuration of a monocrystal pull-up apparatus according to a second exemplary embodiment of the invention.

DESCRIPTION OF EMBODIMENT(S)

First Exemplary Embodiment

Figure 1:
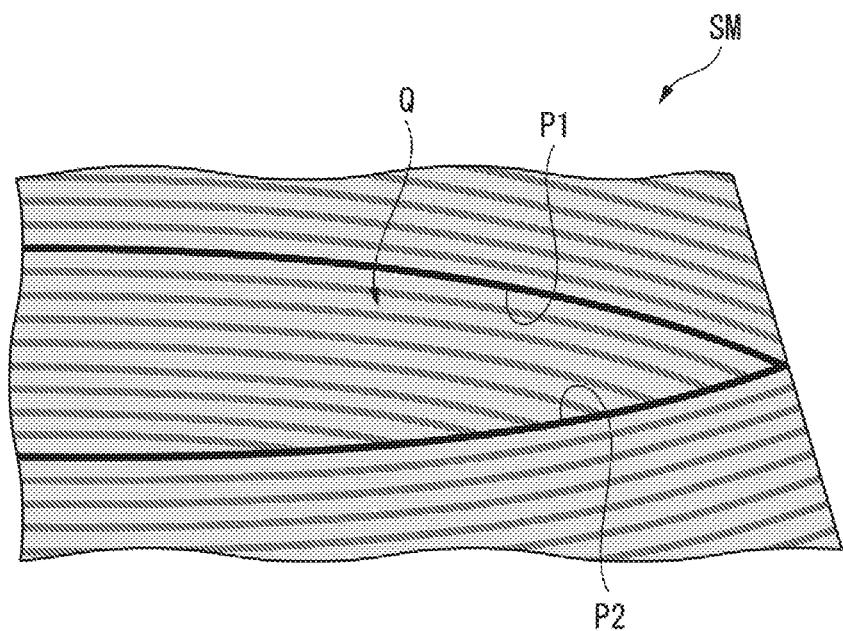
Figure 2:
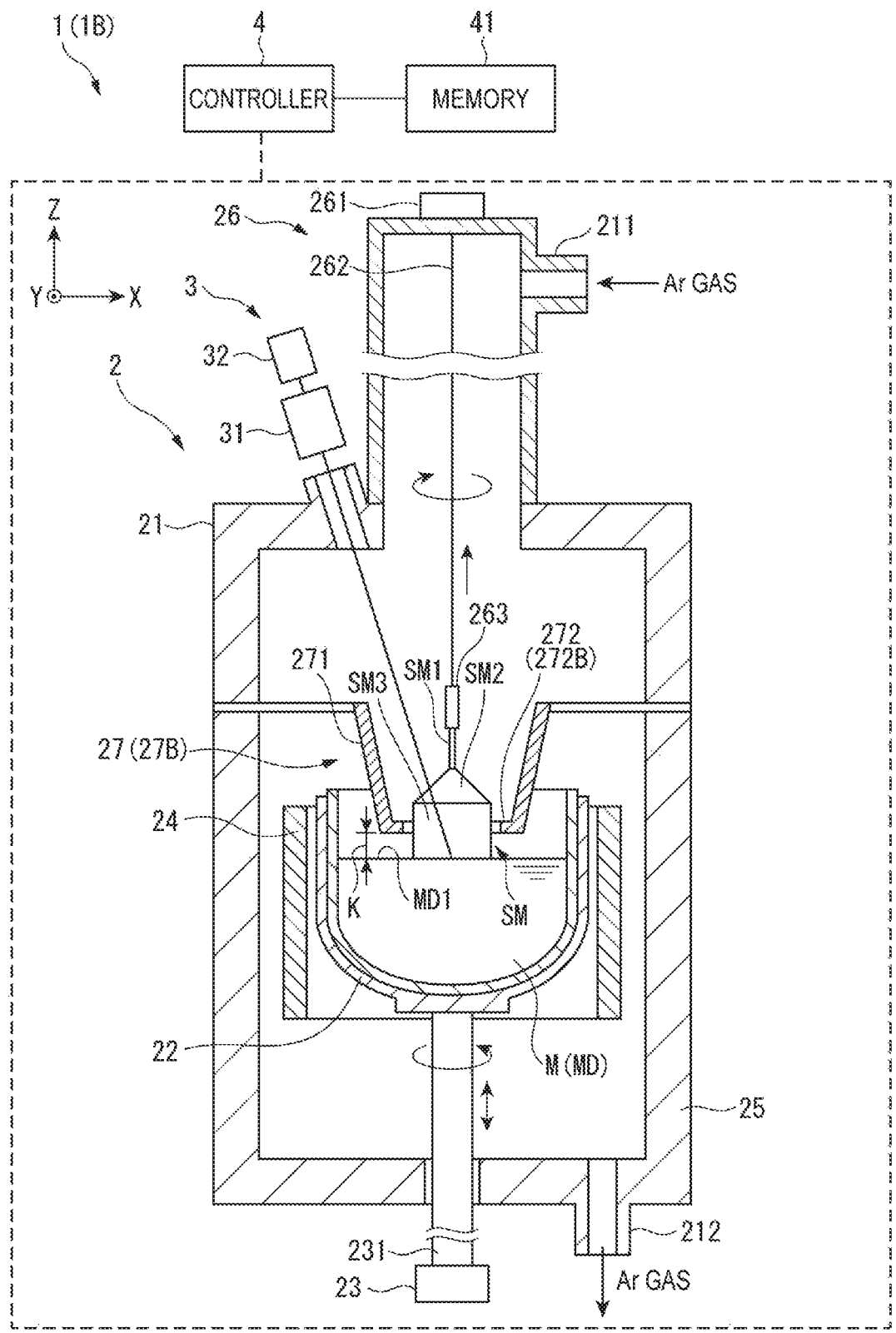

A first exemplary embodiment of the invention will be described below with reference to the attached drawings.
Configuration of Monocrystal Pull-Up Apparatus As shown in FIG. 2, a monocrystal pull-up apparatus 1, which is usable for CZ (Czochralski) method, includes a pull-up apparatus body 2, a liquid surface detector 3, and a controller 4.

The pull-up apparatus body 2 includes a chamber 21, a crucible 22, a crucible driver 23, a heater 24, a heat insulating cylinder 25, a pull-up portion 26, and a heat shield 27.

A gas inlet 211 for introducing inert gas (e.g. Ar gas) into the chamber 21 is provided at an upper part of the chamber 21. A gas outlet 212, through which the gas in the chamber 21 is discharged when a vacuum pump (not shown) is driven, is provided at a lower part of the chamber 21.

In the crucible 22, polycrystalline silicon (i.e. material of the silicon wafer) is melted to provide a silicon melt M.

The crucible driver 23 vertically moves the crucible 22 at a predetermined speed and simultaneously rotates the crucible 22 at a predetermined speed around a support shaft 231 connected to a lower end of the crucible 22.

The heater 24 is disposed outside the crucible 22 to heat the crucible 22.

The heat insulating cylinder 25 is disposed to surround the crucible 22 and the heater 24.

The pull-up portion 26 includes a pull-up drive portion 261 and a pull-up cable 262 whose first end is connected to the pull-up drive portion 261. The pull-up drive portion 261 vertically moves and rotates the pull-up cable 262 at a predetermined speed. A seed holder 263 for holding a seed crystal or a doping device (not shown) is attached to a second end of the pull-up cable 262. The doping device is a device for doping the silicon melt M in the crucible 22 with red phosphorus (dopant) to provide a dopant-added melt MD.

The heat shield 27 has a circular hollow cylindrical lower end portion and surrounds a monocrystalline silicon SM at a part above the crucible 22. The heat shield 27 includes a downwardly tapered cylindrical portion 271 in a form of a hollow truncated cone, and an annular portion 272 in a form of an annular plate projecting from a lower end of the cylindrical portion 271 toward the center of the cylindrical portion 271.

Figure 3:
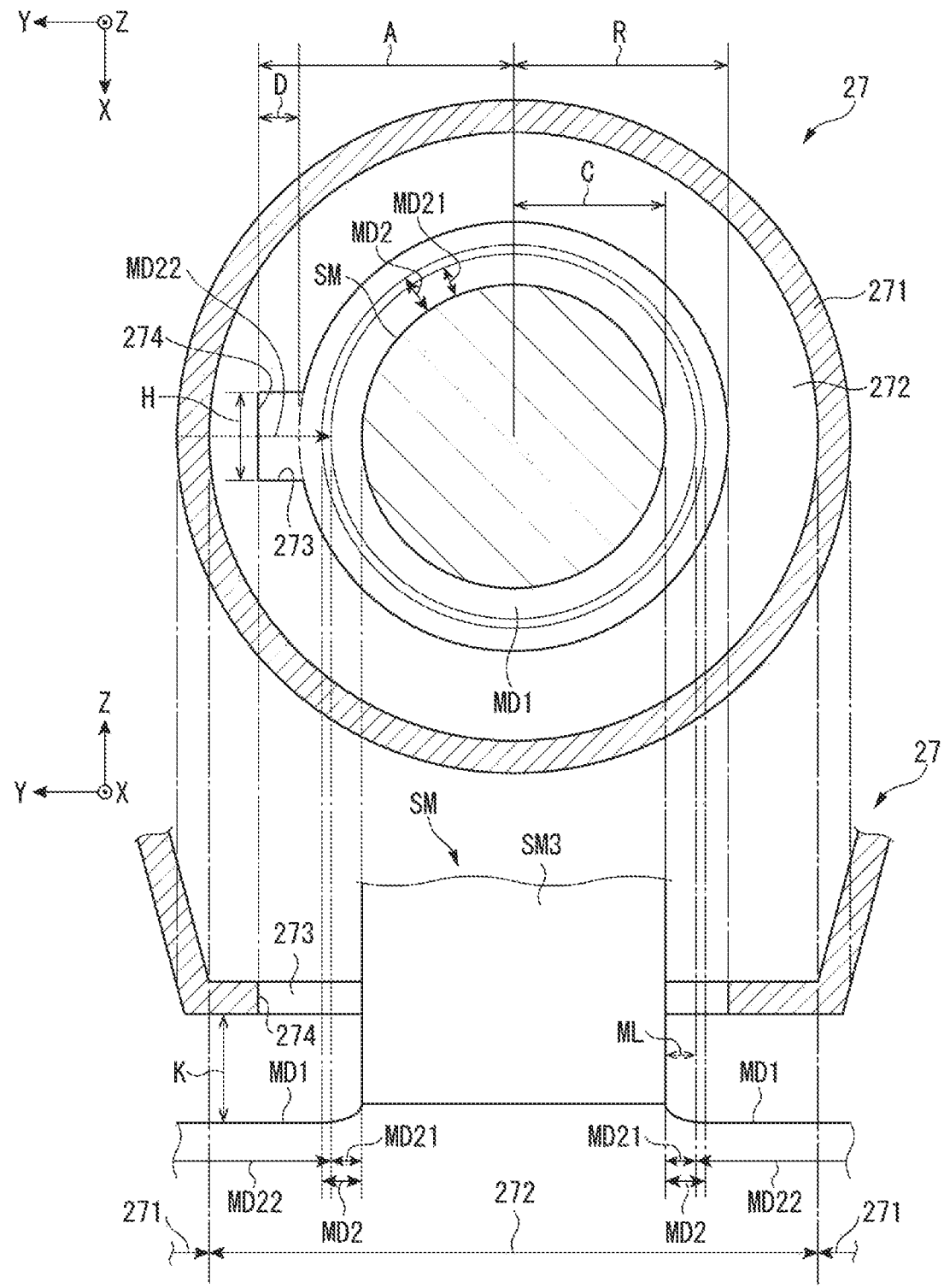

As shown in FIG. 3, a single cut 273 recessed toward an outer periphery is provided to an inner periphery of the annular portion 272 on a near side in FIG. 2 (i.e. in +Y direction).

The heat shield 27 is preferably configured to satisfy formulae (6) and (7) below.

$$(C+30) \times 0.926 \leq R \quad (6)$$

$$R \leq 1.27 \times C \quad (7)$$

C: radius (mm) of a straight body SM3 of the monocrystalline silicon SM

R: inner radius (mm) of the annular portion 272

It should be noted that "30 (mm)" in the formula (6) refers to a width ML of a detection-affecting region MD21. The detection-affecting region MD21 is an annular (in a top plan) and curved (in a vertical cross section) region contained in a meniscus MD2. The detection-affecting region MD21 affects detection of a height of a liquid surface by the liquid surface detector 3. A detection-non-affecting region MD22 located outside the detection-affecting region MD21, which is a flat or substantially flat region in a vertical cross section, does not affect the height detection of the liquid surface.

The cut 273 is preferably configured to satisfy formulae (8), (9) and (10) below.

$$D \leq R \times 0.08 \quad (8)$$

D: maximum depth (i.e. a depth of a deepest portion 274) (mm) of the cut 273 in a top plan $$0.051 \leq H/L \quad (9)$$

$$H/L \leq 0.070 \quad (10)$$

H: maximum width (mm) of the cut 273 in a top plan

L: a length (mm) of an inner circumference of the annular portion 272 assuming that the cut 273 is not present The cut 273 is preferably configured to satisfy a formula (11) below in addition to the formula (8).

$$R \times 0.03 \leq D \quad (11)$$

The shape of the cut 273 satisfying the formula (6) as described above allows the deepest portion 274 of the cut 273 to be located outside the detection-affecting region MD21 in a top plan. The cut 273 is configured to be wide enough to satisfy the formula (9) and deep enough to satisfy the formula (11). As a result, the detection-non-affecting region MD22 can be sufficiently exposed through the cut 273 in a top plan.

It should be noted that R in the formulae (7), (11) can also be defined as "an inner radius of the lower end portion of the heat shield 27" and L in the formulae (9), (10) can also be defined as "a length of an inner circumference of the lower end portion of the heat shield 27 assuming that the cut 273 is not present."

The liquid surface detector 3 is configured to detect a height of the liquid surface MD1 of the dopant-added melt MD. The liquid surface detector 3 includes an image capturing unit 31 and a position calculator 32.

The image capturing unit 31 includes, for instance, a CCD camera, which captures an image of the liquid surface MD1 of the dopant-added melt MD exposed through the cut 273.

The position calculator 32 is configured to calculate the height of the liquid surface MD1 based on the result of the image-capturing of the image capturing unit 31.

The controller 4 is configured to control, for instance, a gas flow rate and furnace pressure in the chamber 21, a temperature for heating the crucible 22 by the heater 24, and rotation speeds of the crucible 22 and the monocrystalline silicon SM, based on information stored in a memory 41 or input from an operator, the result of the height detection of the liquid surface MD1 by the liquid surface detector 3, and the like, to produce the monocrystalline silicon SM.

Monocrystalline Silicon Production Method

Next, a production method of the monocrystalline silicon SM will be described.

It should be noted that an exemplary production process of the monocrystalline silicon SM capable of providing a 200-mm diameter silicon wafer from the straight body SM3 will be described in this exemplary embodiment. However, a monocrystalline silicon SM capable of providing a silicon wafer having a different diameter (e.g. 300 mm and 450 mm) may alternatively be produced.

The diameter of the straight body SM3 is preferably in a range from 201 mm to 230 mm when the diameter of the silicon wafer is 200 mm, in a range from 301 mm to 340 mm when the diameter of the silicon wafer is 300 mm, and in a range from 451 mm to 510 mm when the diameter of the silicon wafer is 450 mm.

Figure 4:
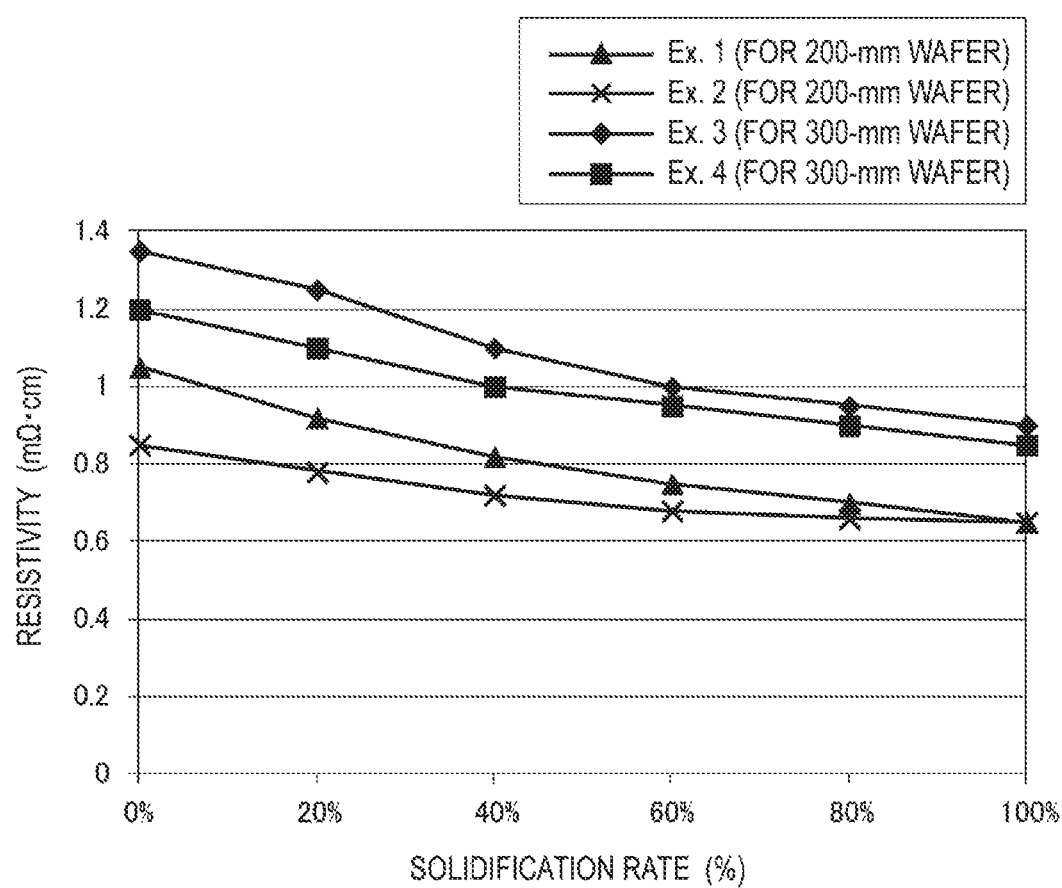

In order to produce the 200-mm diameter silicon wafer (200-mm wafer), resistivity at the lower end of the straight body SM3 (i.e. a position at which the solidification rate is 100%) is preferably in a range from 0.5 mΩ·cm to 0.7 mΩ·cm as shown in, for instance, Examples 1 and 2 in FIG. 4.

In order to produce the 300-mm diameter silicon wafer (300-mm wafer), resistivity at the lower end of the straight body SM3 is preferably in a range from 0.78 mΩ·cm to 1.0 mΩ·cm, as shown in, for instance, Examples 3 and 4 in FIG. 4.

Initially, the controller 4 of the monocrystal pull-up apparatus 1 sets pull-up conditions for satisfying the required quality (e.g. resistivity and oxygen concentration) of the monocrystalline silicon SM. The pull-up conditions include, for instance, flow rate of the inert gas, pressure inside the chamber 21, rotation speeds of the crucible 22 and the monocrystalline silicon SM, and heating conditions of the heater 24. It should be noted that the conditions may be inputted by the operator, or may be calculated by the controller 4 based on the target oxygen concentration and the like inputted by the operator.

Next, the controller 4 controls the heater 24 to heat the crucible 22, thereby melting polysilicon material (silicon material) and a dopant in a form of red phosphorus in the crucible 22 to produce the dopant-added melt MD. The controller 4 then starts introduction of a predetermined flow rate of inert gas through the gas inlet 211 into the chamber 21, and reduces the pressure inside the chamber 21 to create and maintain a depressurized inert atmosphere in the chamber 21.

Subsequently, the controller 4 immerses the seed crystal in the dopant-added melt MD and pulls up the pull-up cable 262 while rotating the crucible 22 and the pull-up cable 262 in a predetermined direction, thereby growing the monocrystalline silicon SM including a neck SM1, a shoulder SM2, the straight body SM3, and a tail (not shown).

While the monocrystalline silicon SM is growing, the monocrystal pull-up apparatus 1 upwardly moves the crucible 22 so that a distance K between the liquid surface MD1 and a lower face of the annular portion 272 becomes at a predetermined value. This process for controlling the upward movement of the crucible 22 so that the distance K stays at the predetermined value will be referred to as a "gap control" hereinafter. During the gap control, the distance K is preferably changed depending on the solidification rate of the monocrystalline silicon SM in order to obtain a monocrystalline silicon with stable quality.

Initially, the image capturing unit 31 of the liquid surface detector 3 captures an image of the liquid surface MD1 of the dopant-added melt MD exposed through the cut 273. At this time, since the detection-non-affecting region MD22 is sufficiently exposed through the cut 273 in a top plan, the image capturing unit 31 can easily capture a non-distorted mirror image of the cut 273 reflected on the detection-non-affecting region MD22. The position calculator 32 calculates the height of the liquid surface MD1 based on the position of the mirror image of the cut 273 captured by the image capturing unit 31.

The controller 4 performs the gap control based on the result of the calculation by the position calculator 32.

Advantages of First Exemplary Embodiment

Since the heat shield 27 satisfying the formula (7) is used in the first exemplary embodiment, heat dissipation from the dopant-added melt MD through the gap between the monocrystalline silicon SM and the annular portion 272 can be reduced. The temperature gradient at the bottom portion of the monocrystalline silicon SM in the pulling direction can thus be increased. Accordingly, the occurrence of dislocation at the bottom portion due to compositional supercooling can be restrained.

The cut 273 provided to the heat shield 27 ensures a sufficient liquid-surface exposure area for checking the position of the liquid surface MD1 in a top plan. The gap control can thus be conducted while the monocrystalline silicon SM is grown. Accordingly, thermal hysteresis and impurity concentration in each of batches of the monocrystalline silicon SM can be made constant, so that the quality of the monocrystalline silicon SM can be stabilized.

Since the cut 273 is configured to satisfy the formulae (8), (10), the temperature distribution in the liquid surface MD1 in the outer circumferential direction of the monocrystalline silicon SM can be stabilized as compared with an instance in which the formula (8) is not satisfied (i.e. the cut 273 is too deep) and an instance in which the formula (10) is not satisfied (i.e. the cut 273 is too wide). Accordingly, the occurrence of dislocation at the top portion of the monocrystalline silicon SM due to remelting can be restrained.

Especially, since only one cut 273 is provided, the maximum width of the cut 273 can be increased to secure a sufficient liquid-surface exposure area. Consequently, the height of the liquid surface MD1 can be easily checked.

Second Exemplary Embodiment

Next, a second exemplary embodiment of the invention will be described below with reference to FIG. 5.

A monocrystal pull-up apparatus 1A according to the second exemplary embodiment differs from the monocrystal pull-up apparatus 1 according to the first exemplary embodiment in that a liquid surface detector 3A using laser beam is provided instead of the liquid surface detector 3 for detecting the height of the liquid surface MD1.

The liquid surface detector 3A includes a light emitter 31A, a light receiver 32A, and a position calculator 33A.

While the monocrystalline silicon SM is grown by the monocrystal pull-up apparatus 1A, the light emitter 31A of the liquid surface detector 3A emits laser beam NL to the liquid surface MD1 of the dopant-added melt MD exposed through the cut 273. The light receiver 32A receives reflected light NR from the liquid surface MD1. At this time, since the detection-non-affecting region MD22 is sufficiently exposed through the cut 273 in a top plan, the laser beam NL enters the detection-non-affecting region MD22 and a reflection angle of the reflected light NR becomes substantially equal to an incident angle of the laser beam NL. Accordingly, a reflecting direction of the reflected light NR can be easily calculated, so that the light receiver 32A can be easily placed at an appropriate position.

The position calculator 33A calculates the height of the liquid surface MD1 based on a light-receiving position of the reflected light NR by the light receiver 32A.

The controller 4 then performs the gap control based on the result of the calculation by the position calculator 33A.

Third Exemplary Embodiment

Next, a third exemplary embodiment of the invention will be described below with reference to FIGS. 2 and 5.

A monocrystal pull-up apparatus 1B according to the third exemplary embodiment differs from the monocrystal pull-up apparatus 1 according to the first exemplary embodiment in that a heat shield 27B including an annular portion 272B without any cut is used instead of the heat shield 27 including the annular portion 272 provided with the cut 273.

In the above arrangement, while the monocrystalline silicon SM is grown by the monocrystal pull-up apparatus 1B, the image capturing unit 31 of the liquid surface detector 3 captures an image of the liquid surface MD1 exposed through a gap between the monocrystalline silicon SM and an inner periphery of the annular portion 272B, and the position calculator 32 calculates the height of the liquid surface MD1. The controller 4 then performs the gap control based on the result of the calculation by the position calculator 32.

The heat shield 27B is preferably configured to satisfy a formula (12) below in addition to the above formula (7).

$$1.17 \times C \leq R \tag{12}$$

When the formula (12) is satisfied, the annular portion 272B is kept from touching the monocrystalline silicon SM.

Further, the heat shield 27B satisfying the formula (7) can reduce heat dissipation from dopant-added melt MD through the gap between the monocrystalline silicon SM and the annular portion 272B. Accordingly, the temperature gradient of the bottom portion of the monocrystalline silicon SM in the pulling direction can be increased, so that occurrence of dislocation at the bottom portion due to compositional supercooling can be restrained.

Modification(s)

It should be noted that the scope of the invention is not limited to the above exemplary embodiments but may include, for instance, a variety of improvements and design changes as long as such improvements and design changes are compatible with the invention. Specific procedures and arrangements in practicing the invention can be modified as long as an object of the invention can be achieved.

Figure 7A:
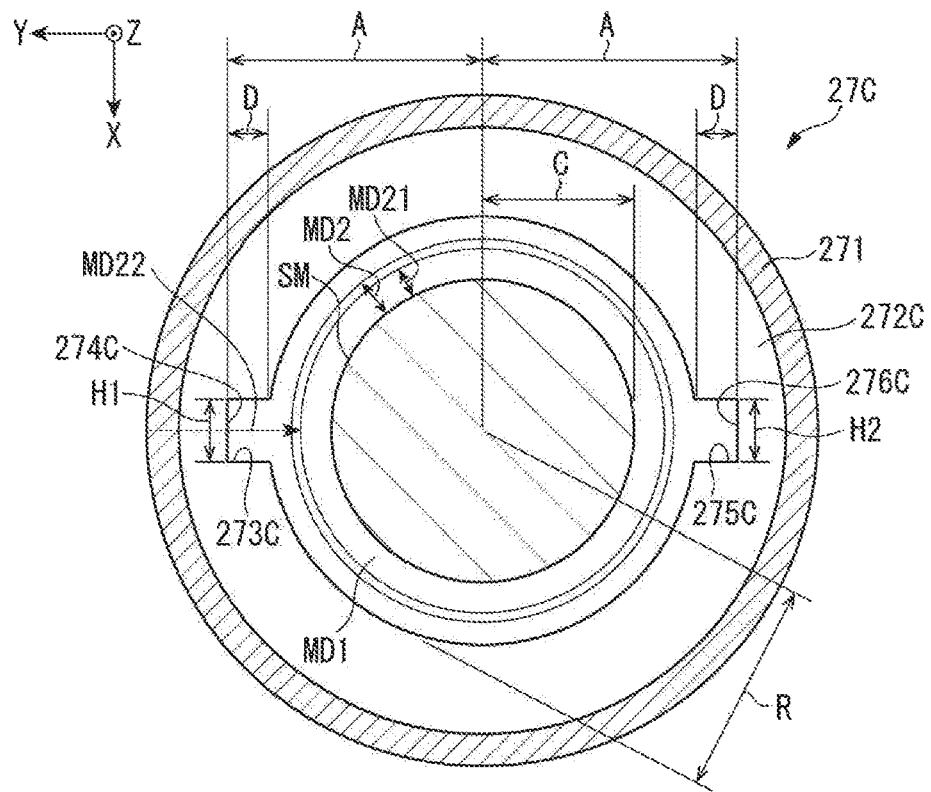
FIG. 7A is a cross-sectional view showing a configuration of a heat shield according to another modification of the invention.
Figure 7B:
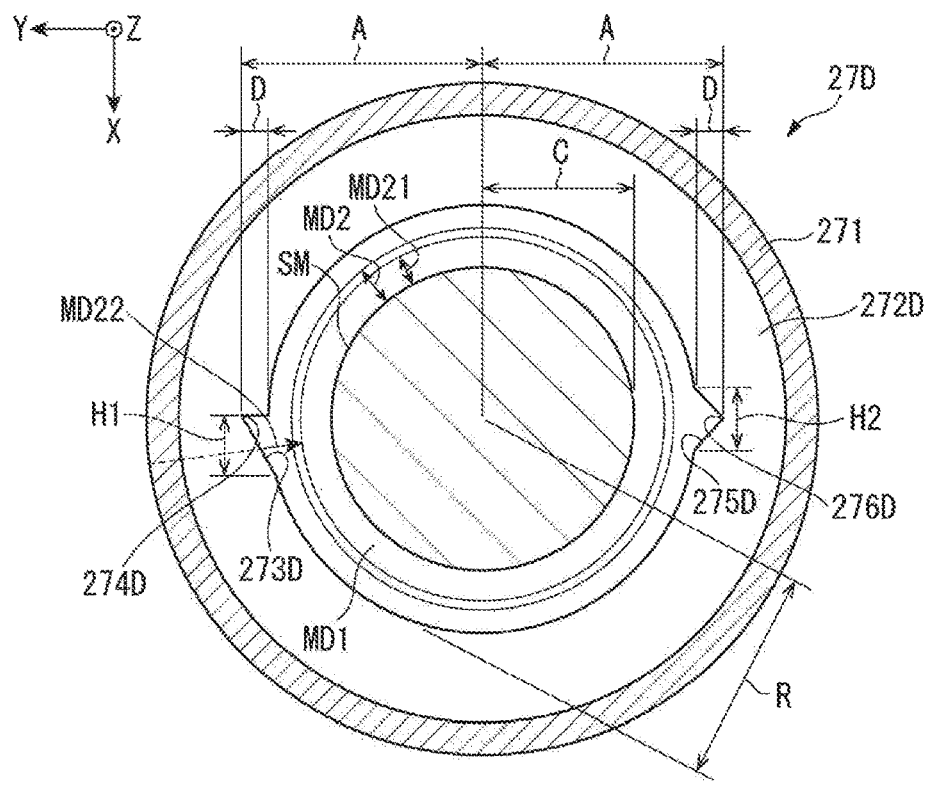
FIG. 7B is a cross-sectional view showing a configuration of a heat shield according to still another modification of the invention.

For instance, the heat shield 27 for the monocrystal pull-up apparatus 1 and the monocrystal pull-up apparatus 1A may be replaced with a heat shield 27C or a heat shield 27D shown in FIGS. 7A and 7B, respectively.

A cut 273C and a cut 275C are provided to an annular portion 272C of the heat shield 27C. In order to stabilize the temperature distribution at the liquid surface MD1 in the outer circumferential direction of the monocrystalline silicon SM, it is preferable that the cut 273C and the cut 275C are symmetrical across the center of the monocrystalline silicon SM.

A cut 273D and a cut 275D are provided to an annular portion 272D of the heat shield 27D.

The heat shields 27C, 27D preferably satisfy the formulae (6) and (7).

The cuts 273C, 275C, 273D and 275D preferably satisfy the formulae (8), (9), (10) and (11). Maximum widths H1 of the cuts 273C and 273D and maximum widths H2 of the cuts 275C and 275D each may satisfy the formulae (9) and (10). Alternatively, a total width H of the maximum width H1 and the maximum width H2 may satisfy the formulae (9) and (10). It should be noted that "D" in the formulae (8) and (11) represents a depth of each of deepest portions 274C, 276C, 274D and 276D of the respective cuts 273C, 275C, 273D and 275D.

Figure 8:
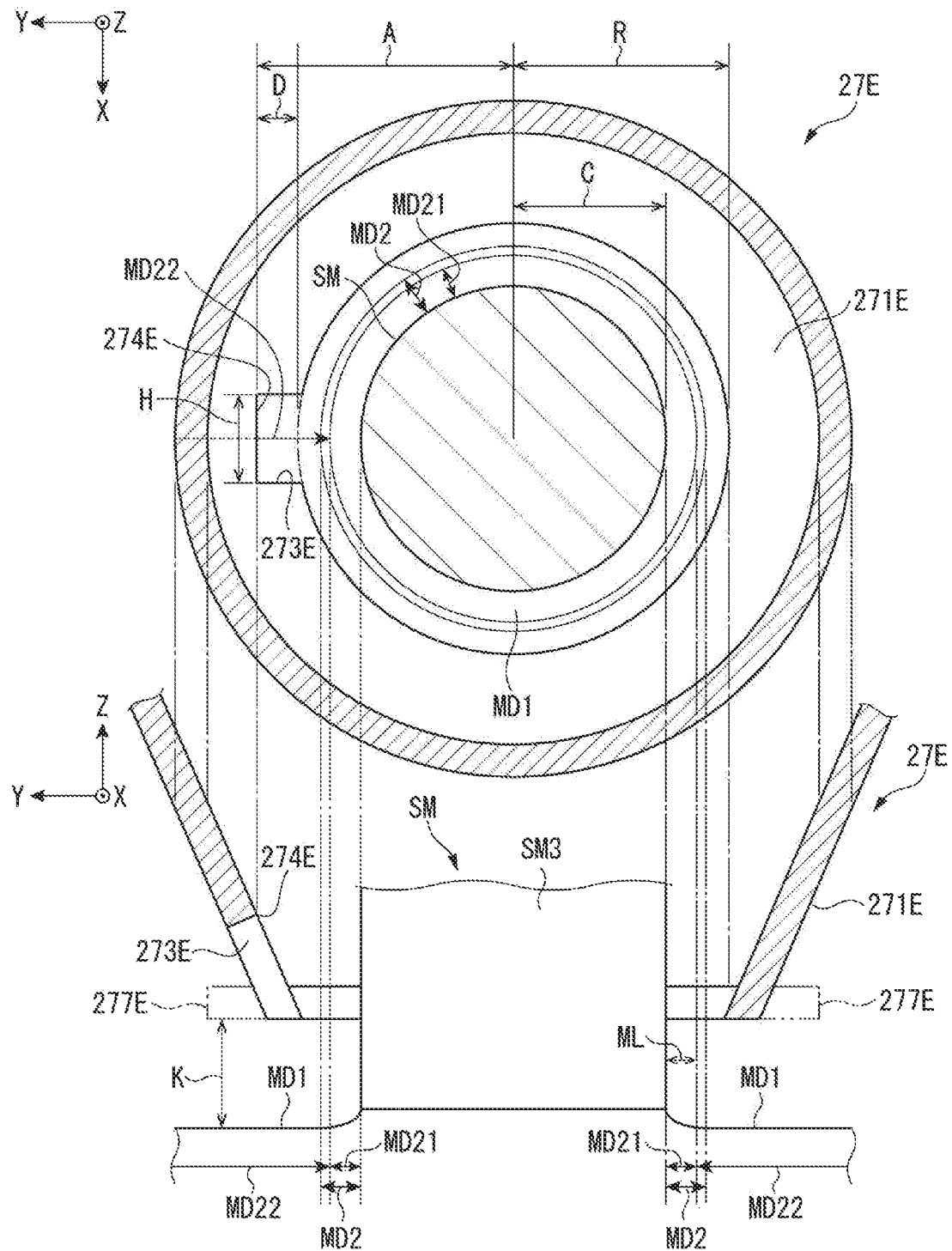
FIG. 8 is a cross-sectional view showing a configuration of a heat shield according to further modification of the invention.
Figure 9:
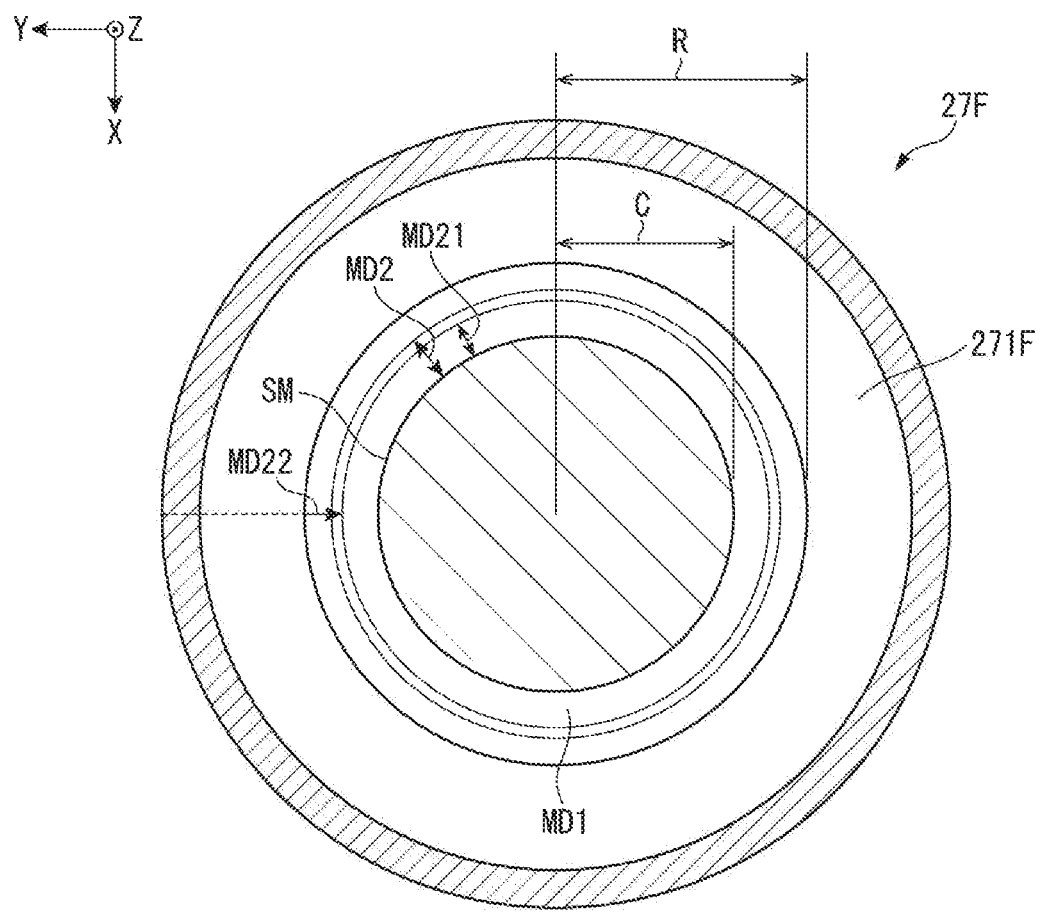
FIG. 9 is a cross-sectional view showing a configuration of a heat shield according to still further modification of the invention.

The heat shields 27 for the monocrystal pull-up apparatus 1 and the monocrystal pull-up apparatus 1A may be replaced with a heat shield 27E or a heat shield 27F having a circular hollow cylindrical lower end portion, as shown in FIGS. 8 and 9, respectively.

As shown in FIG. 8, the heat shield 27E consists of a cylindrical portion 271E in a form of a hollow truncated cone that is tapered downward. An upwardly extending cut 273E is provided at a part of an outer circumference of the cylindrical portion 271E of the heat shield 27E. It should be noted that an outward projection 277E in a form of a flange extending outward from a lower end of the cylindrical portion 271E may be provided as shown in chain double-dashed lines.

The heat shield 27E preferably satisfies a formula (1) below and the above formula (6). The cut 273E preferably satisfies formulae (4) and (5) below and the above formulae (8) and (11). It should be noted that "D" in the formulae (8) and (11) represents a depth of a deepest portion 274E of the cut 273E in a top plan.

$$R \leq 1.27 \times C \tag{1}$$

C: a radius (mm) of the straight body SM3 of the monocrystalline silicon SM

R: an inner radius (mm) at the lower end portion of the heat shield 27E $$0.051 \leq H/L \tag{4}$$

$$H/L \leq 0.070 \tag{5}$$

H: a maximum width (mm) of the cut 273E in a top plan

L: a length (mm) of an inner circumference of the lower end portion of the heat shield 27E assuming that the cut 273E is not present As shown in FIG. 9, the heat shield 27F consists of a cylindrical portion 271F in a form of a hollow truncated cone that is tapered downward and has no cut.

The heat shield 27F preferably satisfies the above formula (12) in addition to the formula (1).

Figure 5:
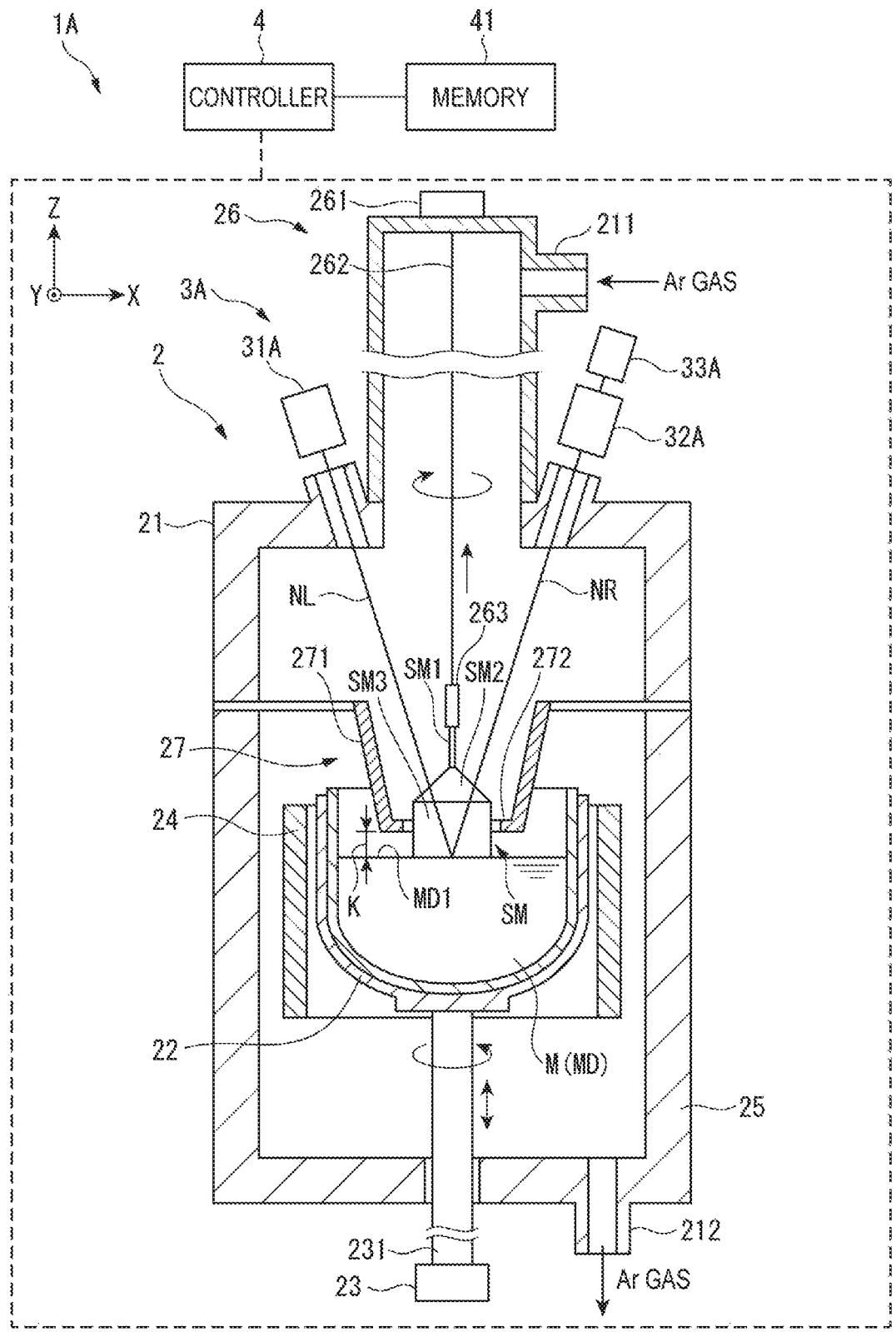
Figure 6:
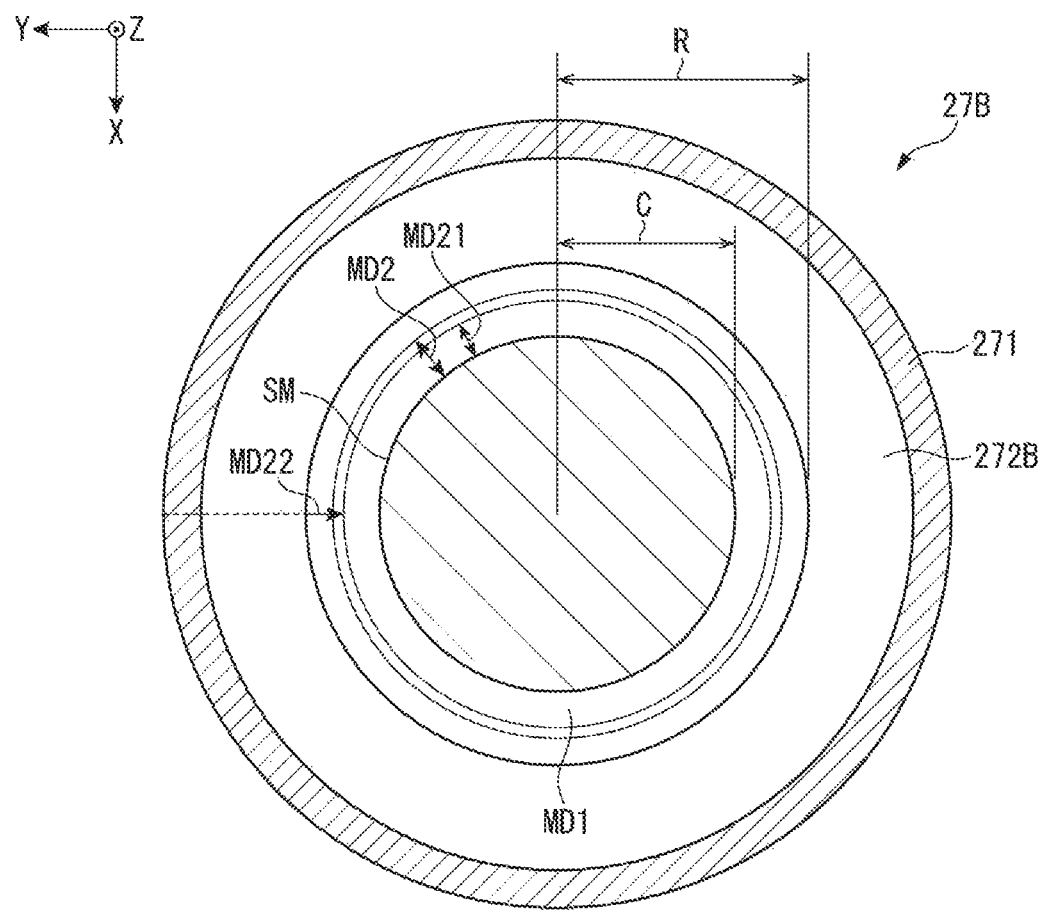
FIG. 6 is a cross-sectional view showing a configuration of a heat shield according to a modification of the invention.

The heat shield 27B as shown in FIG. 6 may be used in the monocrystal pull-up apparatus 1A shown in FIG. 5.

The number of cuts provided to the annular portion of the heat shield is three or more in some embodiments. The shape of the cut(s) is different from the shape of the above-described cut(s) in some embodiments (e.g. semi-circular).

During the gap control, the height of the liquid surface MD1 is visually checked in some embodiments. Alternatively, the crucible 22 is moved upward with reference to past production results without detecting the height of the liquid surface MD1 in some embodiments.

The shape of the cylindrical portions 271, 271E and 271F may be designed in any manner as long as the cylindrical portions each have a circular hollow cylindrical lower end portion. For instance, the cylindrical portions may be a downwardly flared hollow truncated cone, a cylinder of constant diameter at any vertical position thereof, a combination of a hollow truncated cone and a cylinder, and a combination of a tapered hollow truncated cone and a flared hollow truncated cone.

EXAMPLES

Next, the invention will be described in more detail below with reference to Examples. However, it should be noted that the scope of the invention is by no means limited by these Examples.

Experiment 1: Relationship Between Inner Radius of Annular Portion of Heat Shield and Dislocation at Bottom Portion of Monocrystalline Silicon Monocrystalline Silicon Production Method Experimental Example 1

A heat shield with no cut in the annular portion as shown in FIG. 6 was prepared. Inner radius R of the annular portion was 140 mm as shown in Table 1 below. The heat shield of the Experimental Example 1 was set in a monocrystal pull-up apparatus as shown in FIG. 2. A monocrystalline silicon for a 200-mm wafer was produced with the monocrystal pull-up apparatus. A straight body of the monocrystalline silicon had a radius C of 102.5 mm and target resistivity at the lower end of the straight body was in a range from 0.5 mΩ·cm to 0.7 mΩ·cm as shown in Example 1 or 2 in FIG. 4. The dopant was red phosphorus.

Experimental Examples 2 to 9

In each of Experimental Examples 2 to 5, a monocrystalline silicon was produced under the same conditions as those in Experimental Example 1 except that the inner radius R of the heat shield was set at a value shown in Table 1.

In each of Experimental Examples 6 to 9, a monocrystalline silicon was produced under the same conditions as those in Experimental Example 1 except that the inner radius R of the heat shield was set at a value shown in Table 1, the monocrystalline silicon was for a 300-mm wafer with a straight body having a radius C of 153.5 mm, and target resistivity at the lower end of the straight body was in a range from 0.78 mΩ·cm to 1.0 mΩ·cm as shown in Example 3 or 4 in FIG. 4.

between the monocrystalline silicon and the annular portion is restrained, and, consequently, a temperature gradient at the bottom portion in the pulling direction becomes large, thereby restraining the occurrence of dislocation due to compositional supercooling.

It is confirmed from the above that the occurrence of dislocation at the bottom portion can be restrained by designing the heat shield so that R/C is 1.27 or less (i.e. the formula (7) is satisfied).

Experiment 2: Relationship Between Cut Shape of Heat Shield and Dislocation at Top Portion of Monocrystalline Silicon Monocrystalline Silicon Production Method Experimental Example 10

A prepared heat shield had a single cut in the annular portion as shown in FIG. 3. An inner radius R of the annular portion, a maximum width H of the cut in a top plan, and a distance A from the center of the annular portion to the deepest portion of the cut were set as shown in Table 2 below. The heat shield of the Experimental Example 10 was set in a monocrystal pull-up apparatus as shown in FIG. 2. A monocrystalline silicon for a 200-mm wafer was produced with the monocrystal pull-up apparatus. Target resistivity at the lower end of the straight body was 0.7 mΩ·cm or less as shown in Example 1 or 2 in FIG. 4.

Experimental Examples 11 to 13

A monocrystalline silicon was produced under the same conditions as those in Experimental Example 10 except that

TABLE 1

| | Target Resistivity | Inner Radius of Annular Portion (Lower End Portion of Heat Shield) R(mm) | Monocrystal Radius C(mm) | Ratio of Inner Radius of Annular Portion R/C | Number of Trials | Number of Acceptable Samples | Dislocation-Free Rate at Bottom Portion |
|---|---|---|---|---|---|---|---|
| Ex. 1 | 0.7 mΩ · cm or less | 140 | 102.5 | 1.37 | 2 | 0 | 0% |
| Ex. 2 | | 135 | 102.5 | 1.32 | 3 | 1 | 33% |
| Ex. 3 | | 130 | 102.5 | 1.27 | 5 | 4 | 80% |
| Ex. 4 | | 125 | 102.5 | 1.22 | 2 | 2 | 100% |
| Ex. 5 | | 120 | 102.5 | 1.17 | 1 | 1 | 100% |
| Ex. 6 | 1.0 mΩ · cm or less | 200 | 153.5 | 1.30 | 2 | 0 | 0% |
| Ex. 7 | | 195 | 153.5 | 1.27 | 3 | 2 | 67% |
| Ex. 8 | | 190 | 153.5 | 1.24 | 4 | 4 | 100% |
| Ex. 9 | | 185 | 153.5 | 1.21 | 8 | 8 | 100% |

Analysis

Table 1 shows the ratio of the inner radius of annular portion (R/C), the number of produced monocrystalline silicon (the number of trials), the number of monocrystalline silicon with no dislocation at the bottom portion (the number of acceptable samples) and the dislocation-free rate at the bottom portion (the number of acceptable samples/the number of trials) in Experimental Examples 1 to 9.

As shown in Table 1, the dislocation-free rate at the bottom portion in Experimental Examples 3 to 5 and 7 to 9 exceeded 66%. The ratio of the inner radius of the annular portion (R/C) was 1.27 or less.

It is speculated that, since the distance from the outer periphery of the monocrystalline silicon to the inner periphery of the annular portion is reduced to a certain degree, heat dissipation from the dopant-added melt through the gap the inner radius R, the maximum width H, and the distance A of the heat shield were set as shown in Table 2.

TABLE 2

| | Ex. 10 | Ex. 11 | Ex. 12 | Ex. 13 |
|---|---|---|---|---|
| Inner Radius R of Annular Portion (Lower End of Heat Shield) (mm) | 117.5 | 125.0 | 125.0 | 125.0 |
| Radius C of Monocrystalline Silicon (mm) | 102.5 | 102.5 | 102.5 | 102.5 |
| Ratio of Inner Radius of Annular Portion R/C | 1.15 | 1.22 | 1.22 | 1.22 |
| Cut Maximum Width H (mm) | 56 | 51 | 55 | 55 |

TABLE 2-continued

| | Ex. 10 | Ex. 11 | Ex. 12 | Ex. 13 |
|---|---|---|---|---|
| Length L (mm) (=2πR) of Inner Circumference of Annular Portion (Lower End Portion of Heat Shield) Assuming That Cut Is Not Present | 738 | 785 | 785 | 785 |
| Ratio of Cut Width H/L | 0.076 | 0.065 | 0.070 | 0.070 |
| Distance A (mm) from Center of Annular Portion (Lower End of Heat Shield) to Deepest Portion of Cut | 129 | 132 | 135 | 129 |
| Cut Depth Ratio R/A | 0.911 | 0.947 | 0.926 | 0.969 |
| Cut Maximum Depth D (mm) (=A − R) | 11.5 | 7.0 | 10.0 | 4.0 |
| Number of Trials | 5 | 20 | 5 | 10 |
| Number of Acceptable Samples | 1 | 17 | 4 | 9 |
| Dislocation-Free Rate at Top Portion | 20% | 85% | 80% | 90% |
| Gap Control Stability A: Stable, B: Unstable | B | A | A | A |
| Whether Formula (6) (122.7 ≤ R) Is Satisfied A: Satisfied, B: Not Satisfied | B | A | A | A |
| Value of R × 0.08 | 9.4 | 10 | 10 | 10 |
| Whether Formula (8) (D ≤ R × 0.08) Is Satisfied A: Satisfied, B: Not Satisfied | B | A | A | A |

Analysis

Table 2 shows the ratio of the inner diameter of the annular portion (R/C), the length L (L=2πR) of the inner circumference of the annular portion assuming that the cut is not present, the cut width ratio (H/L), the cut depth ratio (R/A), the cut maximum depth D (=A−R), the number of trials, the number of acceptable samples, the dislocation-free rate (the number of acceptable samples/the number of trials) at the top portion of the straight body, and the gap control stability in Experimental Examples 10 to 13.

As shown in Table 2, the dislocation-free rate at the top portion exceeded 80% and the gap control could be stably conducted in Experimental Examples 11 to 13. In contrast, the dislocation-free rate at the top portion became as low as 20% and the gap control could not be stably conducted in Experimental Example 10.

The cut width ratio (H/L) in each of Experimental Examples 11 to 13 was in a range from 0.065 to 0.070, and the cut width ratio (R/A) was in a range from 0.926 to 0.969.

It should be noted that the gap control was stably conducted when the distance K between the liquid surface MD1 and the lower face of the annular portion 272 could be controlled within a range of a preset value ±2 mm.

It is speculated that the dislocation-free rate at the top portion is lowered when H/L exceeds 0.070 (i.e. when the cut width is too large) because the temperature distribution at the dopant-added-melt liquid surface in the outer circumferential direction of the monocrystalline silicon becomes unstable and, consequently, a remelt growth area caused by remelting is generated at the shoulder of the monocrystalline silicon, causing dislocation at the top portion.

Meanwhile, the cut maximum width H is preferably 40 mm or more in order to ensure a sufficient liquid-surface exposure area for the gap control. Accordingly, the heat shield is preferably designed so that H/L becomes 0.051 (=40/785) or more.

It is thus confirmed that the heat shield configured to satisfy the formulae (9) and (10) can restrain the occurrence of dislocation at the top portion and allows an optimal gap control to produce a monocrystalline silicon with stable quality.

The dislocation-free rate at the top portion is lowered when R/A is less than 0.926 (i.e. when the cut is too deep) because, as in an instance where the cut width is too wide, the temperature distribution at the dopant-added-melt liquid surface in the outer circumferential direction of the monocrystalline silicon becomes unstable.

In contrast, when R/A exceeds 0.969 (i.e. when the cut is too shallow), it is possible that a sufficient liquid-surface exposure area for the gap control cannot be secured.

It is thus confirmed that the heat shield configured to satisfy the formulae (2) and (3) below can restrain the occurrence of dislocation at the top portion and allow an optimal gap control to produce a monocrystalline silicon with stable quality.

$$0.926 \leq R/A \quad (2)$$

$$R/A \leq 0.969 \quad (3)$$

Since a meniscus is inevitably formed around the monocrystalline silicon, the detection-non-affecting region of the meniscus is preferably exposed through the cut in order to conduct more stable gap control and enhance the quality of the monocrystalline silicon. It is thus necessary to locate the deepest portion of the cut at an outside of the detection-affecting region.

As described above, the width of the detection-affecting region is 30 mm and the minimum value of R/A (cut depth ratio) is determined to be 0.926 according to the formula (2). Thus, the formula (6) can be derived by assigning "C (radius of monocrystalline silicon)+30 (width of detection-affecting region)" to "A" in the formula (2).

A formula "122.7≤R" can be derived by assigning the value C in each of Experimental Examples 10 to 13 into the formula (6). The Experimental Examples 11 to 13 satisfy the above formula, while the Experimental Example 10 does not satisfy the above formula. These results agree with the evaluation results of the gap control stability in Table 2.

It is thus confirmed that the heat shield configured to satisfy the formula (6) can stabilize the gap control and, consequently, can produce a monocrystalline silicon with more stable quality.

With regard to the depth of the cut in view of the above-described meniscus, the maximum depth D of the cut is represented by "A−R." Since the minimum value of R/A is determined to be 0.926 according to the formula (2), the formula (8) can be derived by assigning "A−R" into the formula (2) and modifying the formula.

The value of R in each of Experimental Examples 10 to 13 is assigned to the formula (8) to check whether the formula (8) is satisfied in Experimental Examples 10 to 13. While the Experimental Examples 11-13 satisfy the formula (8), the Experimental Example 10 does not satisfy the formula (8). These results agree with the evaluation results of the gap control stability in Table 2.

It is thus confirmed that the heat shield configured to satisfy the formula (8) in addition to the formula (6) can stabilize the gap control and, consequently, produce a monocrystalline silicon with more stable quality.

The invention claimed is:

1. A method of producing a monocrystalline silicon using a monocrystal pull-up apparatus comprising:
   a crucible configured to receive a dopant-added melt comprising a silicon melt and red phosphorus added to the silicon melt,
   a crucible driver configured to vertically move and rotate the crucible;

a pull-up portion configured to pull up a seed crystal after bringing the seed crystal into contact with the dopant-added melt to grow the monocrystalline silicon;

a heat shield disposed above the crucible to surround the monocrystalline silicon, a lower end portion of the heat shield being in a form of a circular hollow cylinder; and a chamber configured to house the crucible and the heat shield, the method comprising:

growing the monocrystalline silicon using the heat shield satisfying a formula (1) below, $$R \leq 1.27 \times C \quad (1)$$

where:

C represents a radius (mm) of a straight body of the monocrystalline silicon, and R represents an inner radius (mm) of the heat shield at the lower end portion thereof;

wherein:

the heat shield is provided with at least one cut recessed from an inner periphery of the lower end portion of the heat shield toward an outer periphery thereof, and the heat shield further satisfies formulae (2) and (3) below, $$0.926 \leq R/A \quad (2)$$

$$R/A \leq 0.969 \quad (3)$$

where A represents a distance (ram) from a center of the lower end portion of the heat shield to a radially deepest portion of the lower end portion at the cut relative to a top plan view.

2. A method of producing a monocrystalline silicon using a monocrystal pull-up apparatus comprising:

a crucible configured to receive a dopant-added melt comprising a silicon melt and red phosphorus added to the silicon melt;

a crucible driver configured to vertically move and rotate the crucible;

a pull-up portion configured to pull up a seed crystal after bringing the seed crystal into contact with the dopant-added melt to grow the monocrystalline a heat shield disposed above the crucible to surround the monocrystalline silicon. a lower end portion of the heat shield being in a form of a circular hollow cylinder; and a chamber configured to house the crucible and the heat shield, the method comprising:

growing the monocrystalline silicon using the heat shield satisfying a formula (I) below, $$R \leq 1.27 \times C \quad (1)$$

where:

C represents a radius (mm) of a straight body of the monocrystalline silicon, and R represents an inner radius (mm) of the heat shield at the lower end portion thereof;

wherein:

the heat shield is provided with at least one cut recessed from an inner periphery of the lower end portion of the heat shield toward an outer periphery thereof; and the heat shield further satisfies formulae (4) and (5) below, $$0.051 \leq H/L \quad (4)$$

$$H/L \leq 0.070 \quad (5)$$

where:

H represents a maximum width (mm) of the cut relative to a top plan view, and

L represents a length (mm) of an inner circumference of the lower end portion of the heat shield assuming that the cut is not present.

3. The method of producing a monocrystalline silicon according to claim 2, wherein the at least one cut is a single cut.

4. The method of producing a monocrystalline silicon according to claim 1, wherein:

in growing the monocrystalline silicon, an image of a liquid surface of the dopant-added melt exposed through the cut is captured, a height of the liquid surface of the dopant-added melt is detected based on a result of the image-capturing, and the crucible is moved upward so that a distance between the liquid surface and a lower end of the heat shield becomes at a predetermined value.

5. The method of producing a monocrystalline silicon according to claim 1, wherein:

in growing the monocrystalline silicon, a laser beam is emitted onto a liquid surface of the dopant-added melt exposed through the cut and a reflected light of the laser beam is received, a height of the liquid surface of the dopant-added melt is detected based on a result of the received reflected light, and the crucible is moved upward so that a distance between the liquid surface and a lower end of the heat shield becomes at a predetermined value.

6. The method of producing a monocrystalline silicon according to claim 1, wherein the heat shield comprises:

a downwardly tapered cylindrical portion in a form of a hollow truncated cone, and an annular portion projecting from a lower end of the cylindrical portion to a. center of the cylindrical portion.

7. The method of producing a monocrystalline silicon according to claim 1, wherein:

the straight body is configured to produce a 200 -mm diameter silicon wafer, and a resistivity at a lower end of the straight body of the grown monocrystalline silicon is in a range from 0.5 mΩ·cm to 0.7 mΩ·cm.

8. The method of producing a monocrystalline silicon according to claim 1, wherein:

the straight body is configured to produce a 300 -mm diameter silicon wafer, and a resistivity at a lower end of the straight body of the grown monocrystalline silicon is in a range from 0.78 mΩ·cm to 1.0 mΩ·cm.

9. A heat shield configured to be installed in a monocrystal apparatus comprising:

a crucible configured to receive a dopant-added melt comprising a silicon melt and red phosphorus added to the silicon melt;

a crucible driver configured to vertically move and rotate the crucible;

a pull-up portion configured to pull up a seed crystal after bringing the seed crystal into contact with a dopant-added melt, to grow the monocrystalline silicon; and a chamber configured to house the crucible and the heat shield, the heat shield being disposed above the crucible to surround the monocrystalline silicon, the heat shield comprising:

a cylindrical portion comprising a circular hollow cylindrical lower end portion, and an annular portion projecting from the lower end portion of the cylindrical portion toward a center of the cylindrical portion, wherein the annular portion is provided with at least one cut recessed from an inner periphery of the annular portion to an outer periphery thereof, the annular portion being configured to satisfy formulae (6), (7) below, $$(C+30) \times 0.926 \leq R \quad (6)$$

$$R \leq 1.27 \times C \quad (7)$$

where

C represents a radius (mm) of a straight body of the monocrystalline silicon, and R represents an inner radius (mm) of the annular portion.

10. The heat shield according to claim 9, wherein the cut is configured to satisfy a formula (8) below, $$D \leq R \times 0.08 \quad (8)$$

where D represents a maximum depth (mm) of the cut relative to a top plan view of the annular portion.

11. The heat shield according to claim 9, wherein the cut is configured to satisfy formulae (9) and (10) below, $$0.051 \leq H/L \quad (9)$$

$$H/L \leq 0.070 \quad (10)$$

where

H represents a maximum width (mm) of the cut relative to a top plan view of the annular portion, and L represents a length (mm) of an inner circumference of the annular portion assuming that the cut is not present.

12. The heat shield according to claim 11, wherein the at least one cut is a single cut.

13. A monocrystal pull-up apparatus comprising:

a crucible configured to receive a dopant-added melt comprising a silicon melt and red phosphorus added to the silicon melt;

a crucible driver configured to vertically move and rotate the crucible;

a pull-up portion configured to pull up a seed crystal after bringing the seed crystal into contact with the dopant-added melt to grow the monocrystalline silicon;

the heat shield according to claim 11, the heat shield being disposed above the crucible to surround the monocrystalline silicon; and a chamber configured to house the crucible and the heat shield.

14. The method of producing a monocrystalline silicon according to claim 2, wherein:

in growing the monocrystalline silicon, an image of a liquid surface of the dopant-added melt exposed through the cut is captured, a height of the liquid surface of the dopant-added melt is detected based on a result of the image-capturing, and the crucible is moved upward so that a distance between the liquid surface and a lower end of the heat shield becomes at a predetermined value.

15. The method of producing a monocrystalline silicon according to claim 2, wherein:

in growing the monocrystalline silicon, a laser beam is emitted onto a liquid surface of the dopant-added melt exposed through the cut and a reflected light of the laser beam is received, a height of the liquid surface of the dopant-added melt is detected based on a result of the received reflected light, and the crucible is moved upward so that a distance between the liquid surface and a lower end of the heat shield becomes at a predetermined value.

16. The method of producing a monocrystalline silicon according to claim 2, wherein the heat shield comprises:

a downwardly tapered cylindrical portion in a form of a hollow truncated cone, and an annular portion projecting from a lower end of the cylindrical portion to a center of the cylindrical portion.

17. The method of producing a monocrystalline silicon according to claim 2, wherein:

the straight body is configured to produce a 200 -mm diameter silicon wafer, and a resistivity at a lower end of the straight body of the grown monocrystalline silicon is in a range from 0.5 mΩ·cm to 0.7 Ω·cm.

18. The method of producing a monocrystalline silicon according to claim 2, wherein:

the straight body is configured to produce a 300 -mm diameter silicon wafer, and a resistivity at a lower end of the straight body of the grown monocrystalline silicon is in a range from 0.78 mΩ·cm to 1.0 Ω·cm.

* * * * *